(12) United States Patent
Zhang et al.

(10) Patent No.: US 9,214,377 B2
(45) Date of Patent: Dec. 15, 2015

(54) METHODS FOR SILICON RECESS STRUCTURES IN A SUBSTRATE BY UTILIZING A DOPING LAYER

(71) Applicant: APPLIED MATERIALS, INC., Santa Clara, CA (US)

(72) Inventors: Ying Zhang, Santa Clara, CA (US); Hua Chung, San Jose, CA (US); Srinivas D. Nemani, Sunnyvale, CA (US); Ludovic Godet, Boston, MA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 113 days.

(21) Appl. No.: 14/068,312

(22) Filed: Oct. 31, 2013

(65) Prior Publication Data

US 2015/0118822 A1    Apr. 30, 2015

(51) Int. Cl.
*H01L 21/76* (2006.01)
*H01L 21/762* (2006.01)
*H01L 21/265* (2006.01)

(52) U.S. Cl.
CPC .... *H01L 21/76224* (2013.01); *H01L 21/26513* (2013.01)

(58) Field of Classification Search
None
See application file for complete search history.

(56) References Cited

U.S. PATENT DOCUMENTS

| 5,071,714 | A | 12/1991 | Rodbell et al. |
|---|---|---|---|
| 5,110,408 | A | 5/1992 | Fujii et al. |
| 5,188,979 | A | 2/1993 | Filipiak |
| 5,200,028 | A | 4/1993 | Tatsumi |
| 5,337,207 | A | 8/1994 | Jones et al. |
| 5,356,833 | A | 10/1994 | Maniar et al. |
| 5,391,244 | A | 2/1995 | Kadomura |
| 5,674,782 | A | 10/1997 | Lee et al. |
| 6,184,072 | B1 | 2/2001 | Kaushik et al. |
| 6,204,141 | B1 | 3/2001 | Lou |
| 6,270,568 | B1 | 8/2001 | Droopad et al. |
| 6,297,095 | B1 | 10/2001 | Muralidhar et al. |
| 6,300,202 | B1 | 10/2001 | Hobbs et al. |
| 6,319,730 | B1 | 11/2001 | Ramdani et al. |
| 6,323,143 | B1 | 11/2001 | Yu |
| 6,326,261 | B1 | 12/2001 | Tsang et al. |
| 6,348,386 | B1 | 2/2002 | Gilmer |
| 6,727,157 | B2 * | 4/2004 | Seo ............................... 438/421 |
| 6,855,643 | B2 | 2/2005 | Nallan et al. |
| 8,278,184 | B1 * | 10/2012 | Chen et al. .................... 438/433 |
| 2011/0097889 | A1 * | 4/2011 | Yuan et al. .................... 438/595 |

* cited by examiner

*Primary Examiner* — Benjamin Sandvik
*Assistant Examiner* — Herve Assouman
(74) *Attorney, Agent, or Firm* — Patterson & Sheridan, LLP

(57) ABSTRACT

Embodiments of the present invention provide a methods for forming silicon recess structures in a substrate with good process control, particularly suitable for manufacturing three dimensional (3D) stacking of fin field effect transistor (Fin-FET) for semiconductor chips. In one embodiment, a method of forming recess structures in a substrate includes etching a first portion of a substrate defined by a second portion formed in the substrate until a doping layer formed in the substrate is exposed.

19 Claims, 5 Drawing Sheets

METHODS FOR SILICON RECESS STRUCTURES IN A SUBSTRATE BY UTILIZING A DOPING LAYER

BACKGROUND

1. Field

Embodiments of the present invention generally relate to methods for forming silicon recess structures in a semiconductor substrate, and more particularly to methods for forming silicon recess structures in a semiconductor substrate utilizing a doping layer implanted by an ion implantation process as an etching stop layer for fin field effect transistor (FinFET) semiconductor manufacturing applications.

2. Description of the Related Art

Reliably producing sub-half micron and smaller features is one of the key technology challenges for next generation very large scale integration (VLSI) and ultra large-scale integration (ULSI) of semiconductor devices. However, as the limits of circuit technology are pushed, the shrinking dimensions of VLSI and ULSI technology have placed additional demands on processing capabilities. Reliable formation of gate structures on the substrate is important to VLSI and ULSI success and to the continued effort to increase circuit density and quality of individual substrates and die.

A patterned mask, such as a photoresist layer or a hardmask layer, is commonly used in forming structures, such as gate structure, shallow trench isolation (STI), bite lines and the like, on a substrate by etching process. The patterned mask is conventionally fabricated by using a lithographic process to optically transfer a pattern having the desired critical dimensions to a layer of photoresist or a hardmask layer. For example, the photoresist layer is then developed to remove undesired portion of the photoresist, thereby creating openings in the remaining photoresist. In the case an additional hardmask layer is utilized, the hardmask layer can then further be etched/patterned using openings formed in the remaining photoresist as an etching mask.

In order to enable fabrication of next generation devices and structures, three dimensional (3D) stacking of semiconductor chips is often utilized to improve performance of the transistors. In particular, fin field effect transistors (FinFET) are often utilized to form three dimensional (3D) stacking of semiconductor chips. By arranging transistors in three dimensions instead of conventional two dimensions, multiple transistors may be placed in the integrated circuits (ICs) very close to each other.

FIG. 1A depicts an exemplary embodiment of a fin field effect transistor (FinFET) 150 disposed on a substrate 100. The substrate 100 may be a silicon substrate, a germanium substrate, or a substrate formed from other semiconductor materials. In one embodiment, the substrate 100 may include p-type or n-type dopants doped therein. The substrate 100 includes a plurality of semiconductor fins 102 formed thereon isolated by shallow trench isolation (STI) structures 104. The shallow trench isolation (STI) structures 104 may be formed by an insulating material, such as a silicon oxide material.

The substrate 100 may includes a portion in NMOS device region 101 and a portion in PMOS device region 103, and each of the semiconductor fins 102 may be sequentially and alternatively formed in the NMOS device region 101 and the PMOS device region 103 in the substrate 100. The semiconductor fins 102, 152 are formed above the top surfaces of the shallow trench isolation (STI) structures 104. Subsequently, a gate structure 106, typically including a gate electrode layer disposed on a gate dielectric layer, is deposited on both of the NMOS device region 101 and the PMOS device region 103 and over the semiconductor fins 102, 152.

The gate structure 106 may be patterned to expose portions 148, 168 of the semiconductor fins 102, 152 uncovered by the gate structure 106. The exposed portions 148, 168 of the semiconductor fins 102 may then be doped with dopants to form pocket and lightly doped source and drain (LDD) regions by an implantation process.

FIG. 1B depicts a cross sectional view of the substrate 100 including the plurality of semiconductor fins 102 formed on the substrate 100 isolated by the shallow trench isolation (STI) structures 104. The plurality semiconductor fins 102 formed on the substrate 100 may be part of the substrate 100 extending upwards from the substrate 100 utilizing the shallow trench isolation (STI) structures 104 to isolate each of the semiconductor fins 102. In another embodiment, the semiconductor fins 102 may be individually formed structures disposed on the substrate 100 that are made from materials different than the substrate 100 using suitable techniques in the art. In the embodiment wherein semiconductor fins 102 is not the part of the substrate 100, silicon recess structures 160, as shown in FIG. 1C, are required to be formed in the substrate 100 and isolated by the shallow trench isolation (STI) structures 104. The silicon recess structures 160 formed in the substrate 100 may then be filled with different materials, such as SiGe containing material, Ge containing material, Group III-V materials, or other compound materials, to form the structures of the semiconductor fins 102.

However, as the designs of the three dimensional (3D) stacking of fin field effect transistor (FinFET) 150 are pushed up against the technology limits for the structure geometry, the need for accurate process control for the manufacture of small critical dimension silicon recess structures 160 in the substrate 100 has become increasingly important. Conventional processes for forming silicon recess structures often suffer from low selectivity, poor profile control and pattern loading effect, thereby resulting in inaccurate silicon recess structure profiles and poor dimension control. For example, a bottom surface 162 (e.g., a front end) of the silicon recess structures 160 is often desired to be maintained flat and/or sharp to as to provide a good interface for the semiconductor fins 102 with different materials to be formed thereon. Furthermore, in the substrate where the silicon recess structures 160 are formed therein with different pattern densities, different etching rates caused by the micro-loading effect often result in profile mismatched or bottom surface roughness due to overetching (or underetching), thereby adversely creating poor profile control over the silicon recess structures 160 after manufacturing process.

Thus, there is a need for improved methods for forming silicon recess structures in a substrate with good profile and dimension control for three dimensional (3D) stacking of semiconductor chips or other semiconductor devices.

SUMMARY

Embodiments of the present invention provide a methods for forming silicon recess structures in a substrate with good process control, particularly suitable for manufacturing three dimensional (3D) stacking of fin field effect transistor (FinFET) for semiconductor chips. In one embodiment, a method of forming recess structures in a substrate includes etching a first portion of a substrate defined by a second portion formed in the substrate until a doping layer formed in the substrate is exposed.

In another embodiment, a method of forming recess structures in a substrate includes performing a first etching process to etch a substrate through openings defined by a patterned mask layer disposed on a surface of the substrate, forming a first recess structure in the substrate, filling an insulating material in the first recess structure in the substrate, performing a second etching process to etch the substrate defined between the insulating material filled in the first recess structure, terminating the second etching process when a doping layer defined in the substrate is reached, and forming a second recess structure in the substrate.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

It is to be noted, however, that the appended drawings illustrate only exemplary embodiments of this invention and are therefore not to be considered limiting of its scope, for the invention may admit to other equally effective embodiments.

DETAILED DESCRIPTION

Embodiments of the present invention provide methods for forming silicon recess structures in a semiconductor substrate utilizing a doping layer as an etching stop layer. The method is particularly useful for three dimensional (3D) stacking of fin field effect transistor (FinFET) semiconductor structures. In one embodiment, the doping layer utilized as an etching stop layer during the silicon recess structure manufacturing process is formed by an ion implantation process. The dopants doped into the substrate may form a doping area defining a doping layer at the interface serving as the etching stop layer during the silicon recess structure manufacturing process. The dopants as implanted may change the lattice structures of the substrate, thereby naturally forming a block layer in the substrate which has different atomic structures and properties than the underlying undoped region, rendering a high selectivity for the etching process. As such, aggressive etchants from an etching process utilized to form the silicon recess structures may be prevented from further attacking the substrate when reaching the doping layer formed in the substrate, thereby allowing silicon recess structures with desired profile and dimension control to be efficiently formed.

Figure 2:
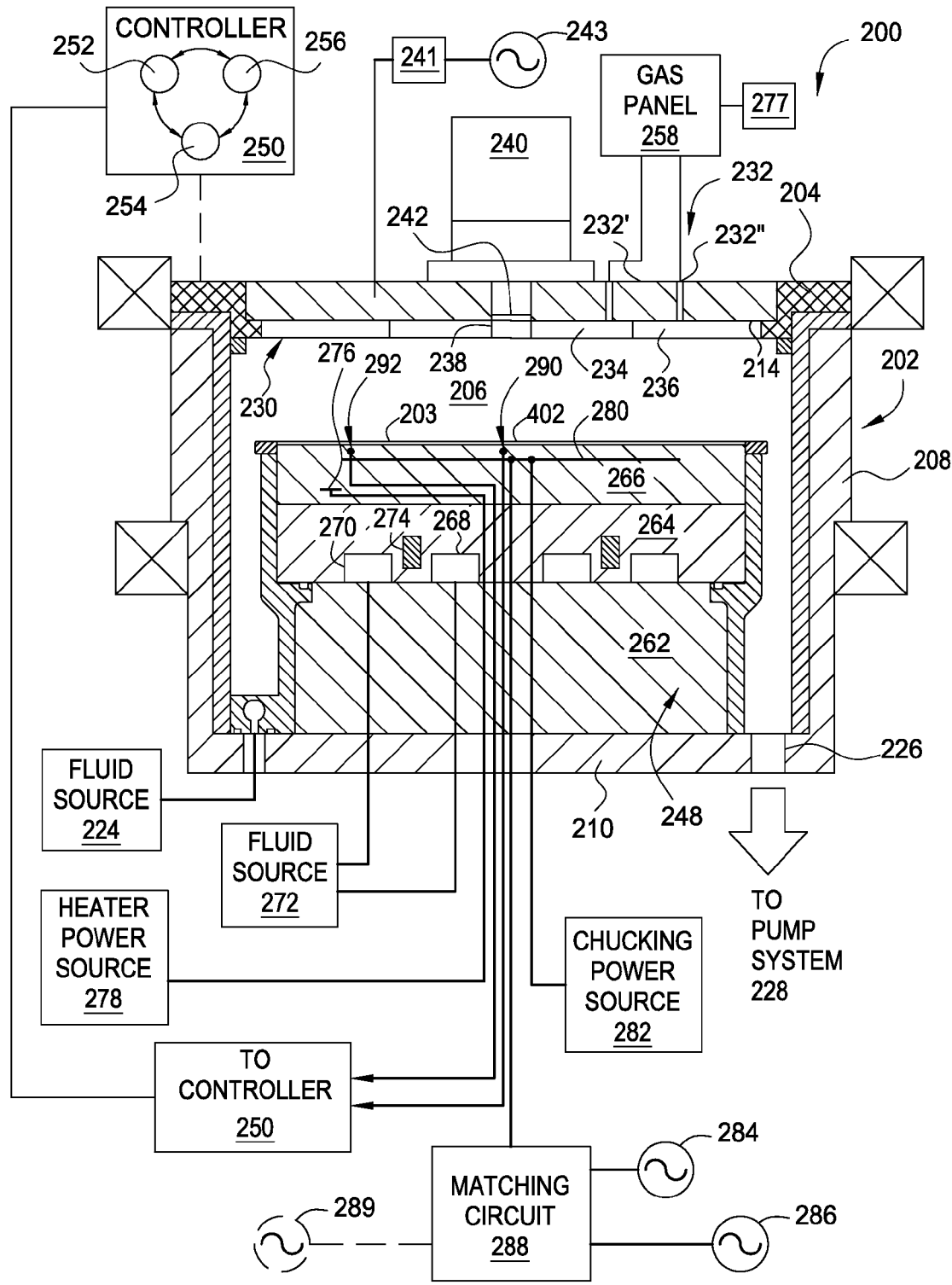
FIG. 2 depicts an apparatus which may be utilized to form silicon recess structures on a substrate.

FIG. 2 is a sectional view of one embodiment of a processing chamber 200 suitable for forming silicon recess structures in a substrate utilizing a doping layer as an etching stop layer using an anisotropic etching process. Suitable processing chambers that may be adapted for use with the teachings disclosed herein include, for example, an ENABLER® processing chamber available from Applied Materials, Inc. of Santa Clara, Calif. Although the processing chamber 200 is shown including a plurality of features that enable superior etching and trimming performance, it is contemplated that other processing chambers may be adapted to benefit from one or more of the inventive features disclosed herein.

The processing chamber 200 includes a chamber body 202 and a lid 204 which enclose an interior volume 206. The chamber body 202 is typically fabricated from aluminum, stainless steel or other suitable materials. The chamber body 202 generally includes sidewalls 208 and a bottom 210. A substrate support pedestal access port (not shown) is generally defined in a sidewall 208 and a selectively sealed by a slit valve to facilitate entry and egress of a substrate 100 from the processing chamber 200. An exhaust port 226 is defined in the chamber body 202 and couples the interior volume 206 to a pump system 228. The pump system 228 generally includes one or more pumps and throttle valves utilized to evacuate and regulate the pressure of the interior volume 206 of the processing chamber 200. In one embodiment, the pump system 228 maintains the pressure inside the interior volume 206 at operating pressures typically between about 10 mTorr to about 500 Torr.

The lid 204 is sealingly supported on the sidewall 208 of the chamber body 202. The lid 204 may be opened to allow excess to the interior volume 106 of the processing chamber 200. The lid 204 includes a window 242 that facilitates optical process monitoring. In one embodiment, the window 242 is comprised of quartz or other suitable material that is transmissive to a signal utilized by an optical monitoring system 240 mounted outside the processing chamber 200.

The optical monitoring system 240 is positioned to view at least one of the interior volume 206 of the chamber body 202 and/or the substrate 100 positioned on a substrate support pedestal assembly 248 through the window 242. In one embodiment, the optical monitoring system 240 is coupled to the lid 204 and facilitates an integrated deposition process that uses optical metrology to provide information that enables process adjustment to compensate for incoming substrate pattern feature inconsistencies (such as thickness, and the like), provide process state monitoring (such as plasma monitoring, temperature monitoring, and the like) as needed. One optical monitoring system that may be adapted to benefit from the invention is the EyeD® full-spectrum, interferometric metrology module, available from Applied Materials, Inc., of Santa Clara, Calif.

A gas panel 258 is coupled to the processing chamber 200 to provide process and/or cleaning gases to the interior volume 206. In the embodiment depicted in FIG. 2, inlet ports 232', 232" are provided in the lid 204 to allow gases to be delivered from the gas panel 258 to the interior volume 206 of the processing chamber 200. In one embodiment, the gas panel 258 is adapted to provide fluorinated process gas through the inlet ports 232', 232" and into the interior volume 206 of the processing chamber 200. In one embodiment, the process gas provided from the gas panel 258 includes at least a fluorinated gas, chlorine, and a carbon containing gas, an oxygen gas, a nitrogen containing gas and a chlorine containing gas. Examples of fluorinated and carbon containing gases include $CHF_3$, $CH_2F_2$ and $CF_4$. Other fluorinated gases may include one or more of $C_2F$, $C_4F_6$, $C_3F_8$ and $C_5F_8$. Examples of the oxygen containing gas include $O_2$, $CO_2$, $CO$, $N_2O$, $NO_2$, $O_3$, $H_2O$, and the like. Examples of the nitrogen containing gas include $N_2$, $NH_3$, $N_2O$, $NO_2$ and the like. Examples of the chlorine containing gas include HCl, $Cl_2$, $CCl_4$, $CHCl_3$, $CH_2Cl_2$, $CH_3Cl$, and the like. Suitable examples of the carbon containing gas include methane ($CH_4$), ethane ($C_2H_6$), ethylene ($C_2H_4$), and the like.

A showerhead assembly 230 is coupled to an interior surface 214 of the lid 204. The showerhead assembly 230 includes a plurality of apertures that allow the gases flowing through the showerhead assembly 230 from the inlet ports 232', 232" into the interior volume 206 of the processing chamber 200 in a predefined distribution across the surface of the substrate 100 being processed in the processing chamber 200.

A remote plasma source 277 may be optionally coupled to the gas panel 258 to facilitate dissociating gas mixture from a remote plasma prior to entering into the interior volume 206 for processing. A RF source power 243 is coupled through a matching network 241 to the showerhead assembly 230. The RF source power 243 typically is capable of producing up to about 3000 W at a tunable frequency in a range from about 50 kHz to about 200 MHz.

The showerhead assembly 230 additionally includes a region transmissive to an optical metrology signal. The optically transmissive region or passage 238 is suitable for allowing the optical monitoring system 240 to view the interior volume 206 and/or the substrate 100 positioned on the substrate support pedestal assembly 248. The passage 238 may be a material, an aperture or plurality of apertures formed or disposed in the showerhead assembly 230 that is substantially transmissive to the wavelengths of energy generated by, and reflected back to, the optical monitoring system 240. In one embodiment, the passage 238 includes a window 242 to prevent gas leakage through the passage 238. The window 242 may be a sapphire plate, quartz plate or other suitable material. The window 242 may alternatively be disposed in the lid 204.

In one embodiment, the showerhead assembly 230 is configured with a plurality of zones that allow for separate control of gas flowing into the interior volume 206 of the processing chamber 200. In the embodiment FIG. 2, the showerhead assembly 230 as an inner zone 234 and an outer zone 236 that are separately coupled to the gas panel 258 through separate inlet ports 232', 232".

The substrate support pedestal assembly 248 is disposed in the interior volume 206 of the processing chamber 200 below the gas distribution (showerhead) assembly 230. The substrate support pedestal assembly 248 holds the substrate 100 during processing. The substrate support pedestal assembly 248 generally includes a plurality of lift pins (not shown) disposed therethrough that are configured to lift the substrate 100 from the substrate support pedestal assembly 248 and facilitate exchange of the substrate 100 with a robot (not shown) in a conventional manner. An inner liner 218 may closely circumscribe the periphery of the substrate support pedestal assembly 248.

In one embodiment, the substrate support pedestal assembly 248 includes a mounting plate 262, a base 264 and an electrostatic chuck 266. The mounting plate 262 is coupled to the bottom 210 of the chamber body 202 includes passages for routing utilities, such as fluids, power lines and sensor leads, among others, to the base 264 and the electrostatic chuck 166. The electrostatic chuck 266 comprises at least one clamping electrode 280 for retaining the substrate 100 below showerhead assembly 230. The electrostatic chuck 266 is driven by a chucking power source 282 to develop an electrostatic force that holds the substrate 100 to the chuck surface, as is conventionally known. Alternatively, the substrate 100 may be retained to the substrate support pedestal assembly 248 by clamping, vacuum or gravity.

At least one of the base 264 or electrostatic chuck 266 may include at least one optional embedded heater 276, at least one optional embedded isolator 274 and a plurality of conduits 268, 270 to control the lateral temperature profile of the substrate support pedestal assembly 248. The conduits 268, 270 are fluidly coupled to a fluid source 272 that circulates a temperature regulating fluid therethrough. The heater 276 is regulated by a power source 278. The conduits 268, 270 and heater 276 are utilized to control the temperature of the base 264, thereby heating and/or cooling the electrostatic chuck 266 and ultimately, the temperature profile of the substrate 100 disposed thereon. The temperature of the electrostatic chuck 266 and the base 264 may be monitored using a plurality of temperature sensors 290, 292. The electrostatic chuck 266 may further comprise a plurality of gas passages (not shown), such as grooves, that are formed in a substrate support pedestal supporting surface of the chuck 266 and fluidly coupled to a source of a heat transfer (or backside) gas, such as He. In operation, the backside gas is provided at controlled pressure into the gas passages to enhance the heat transfer between the electrostatic chuck 266 and the substrate 100.

In one embodiment, the substrate support pedestal assembly 248 is configured as a cathode and includes an electrode 280 that is coupled to a plurality of RF power bias sources 284, 286. The RF bias power sources 284, 286 are coupled between the electrode 280 disposed in the substrate support pedestal assembly 248 and another electrode, such as the showerhead assembly 230 or ceiling (lid 204) of the chamber body 202. The RF bias power excites and sustains a plasma discharge formed from the gases disposed in the processing region of the chamber body 202.

In the embodiment depicted in FIG. 2, the dual RF bias power sources 284, 286 are coupled to the electrode 280 disposed in the substrate support pedestal assembly 248 through a matching circuit 288. The signal generated by the RF bias power 284, 286 is delivered through matching circuit 188 to the substrate support pedestal assembly 248 through a single feed to ionize the gas mixture provided in the plasma processing chamber 200, thereby providing ion energy necessary for performing a deposition or other plasma enhanced process. The RF bias power sources 284, 286 are generally capable of producing an RF signal having a frequency of from about 50 kHz to about 200 MHz and a power between about 0 Watts and about 5000 Watts. An additional bias power source 289 may be coupled to the electrode 280 to control the characteristics of the plasma.

In one mode of operation, the substrate 100 is disposed on the substrate support pedestal assembly 248 in the plasma processing chamber 200. A process gas and/or gas mixture is introduced into the chamber body 202 through the showerhead assembly 230 from the gas panel 258. A vacuum pump system 228 maintains the pressure inside the chamber body 202 while removing deposition by-products.

A controller 250 is coupled to the processing chamber 200 to control operation of the processing chamber 200. The controller 250 includes a central processing unit (CPU) 252, a memory 254, and a support circuit 256 utilized to control the process sequence and regulate the gas flows from the gas panel 258. The CPU 252 may be any form of general purpose computer processor that may be used in an industrial setting. The software routines can be stored in the memory 254, such as random access memory, read only memory, floppy, or hard disk drive, or other form of digital storage. The support circuit 256 is conventionally coupled to the CPU 252 and may include cache, clock circuits, input/output systems, power supplies, and the like. Bi-directional communications between the controller 250 and the various components of the processing chamber 200 are handled through numerous signal cables.

Figure 3:
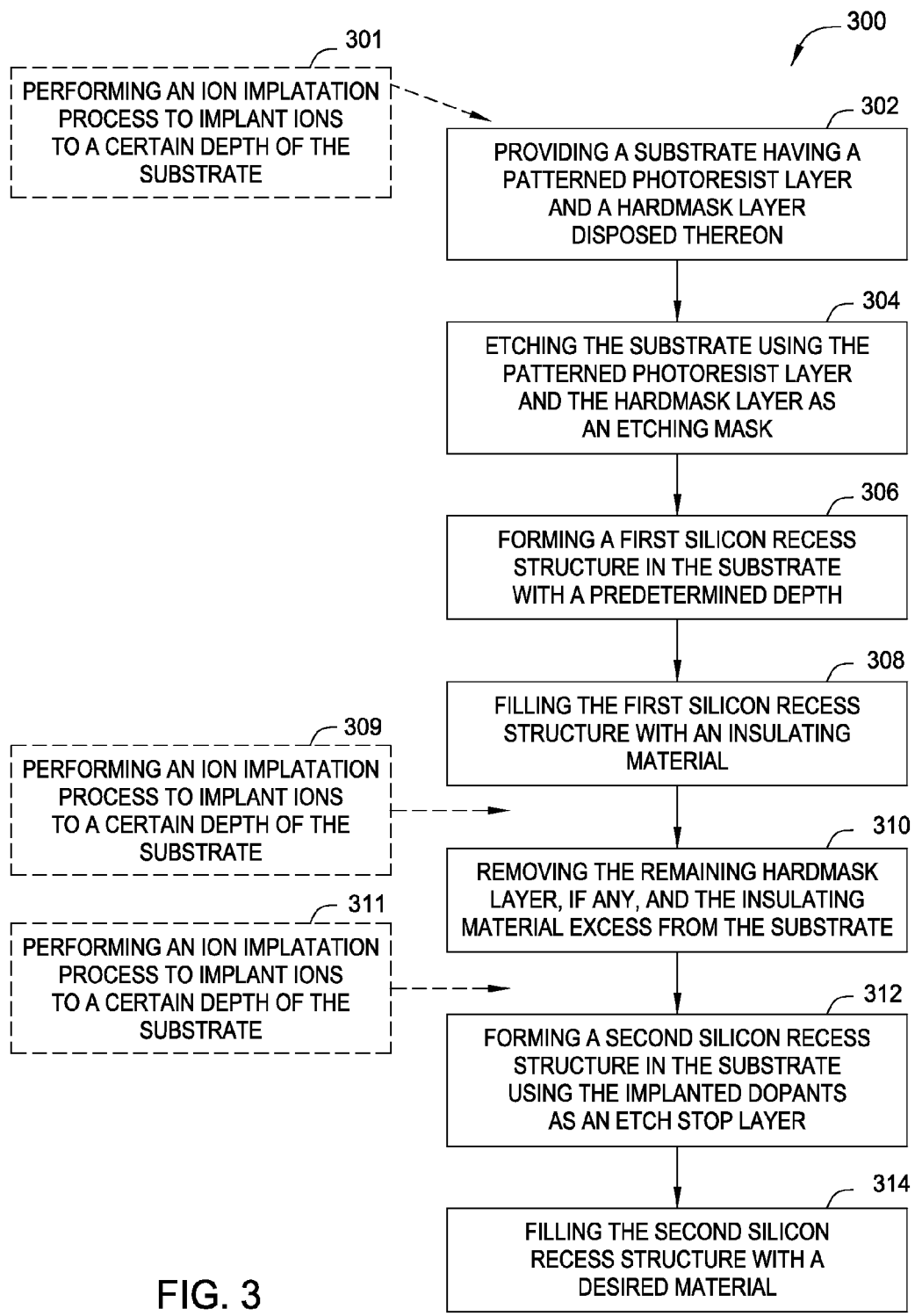
FIG. 3 depicts a flow diagram of a method for form silicon recess structures on a substrate.

FIG. 3 is a flow diagram of one embodiment of silicon recess structure formation process 300 that may be practiced in the chamber 200 or other suitable processing chamber. FIGS. 4A-4G are schematic cross-sectional views of a portion of a composite substrate corresponding to various stages of the process 300. The process 300 may be utilized to form silicon recess structures in a substrate which may later be utilized to form a fin field effect transistor (FinFET) for three dimensional (3D) stacking of semiconductor chips. Alternatively, the process 300 may be beneficially utilized to etch other types of structures.

The process 300 begins at block 302 by providing a substrate 402 having a patterned mask layer, such as patterned photoresist layer 406 and an optional hardmask layer 404, disposed thereon. In some embodiments, prior to etching, processing, forming features or disposing the photoresist layer 406 on or into the substrate, a preliminary step of block 301 may be performed to implant ions to a certain doping depth 415 of the substrate 402, as shown as the dotted line 452a in FIG. 4A, forming a doped area 452a' therebetween. The doped area 452a' formed in the substrate 402 having the predetermined doping depth 415 defines a doping layer 452a as a boundary to an undoped region 452a" in the substrate 402. The doping layer 452a may serve as an etching stop layer during the subsequent silicon recess structure forming process. The doping layer 452a may be formed at different stages during the silicon recess structure manufacturing process, such as at block 309, 311, which will be described later with reference to FIGS. 4D and 4E. Details regarding how the ions may be implanted into the substrate 402 to form the doping layer will be described in greater detail below.

Referring back to FIG. 4A, the patterned photoresist layer 406 having openings 410 (e.g., features) formed therein exposing a surface 408 of an optional hardmask layer 404 for etching. In the embodiment wherein the hardmask layer 404 is not present, the patterned photoresist layer 406 may be formed directly on the substrate 402 exposing a portion of the substrate 402 for etching as needed. In one embodiment, the substrate 402 may be a material such as crystalline silicon (e.g., Si<100> or Si<111>), silicon oxide, strained silicon, silicon germanium, doped or undoped polysilicon, doped or undoped silicon wafers and patterned or non-patterned wafers silicon on insulator (SOI), carbon doped silicon oxides, silicon nitride, doped silicon, germanium, gallium arsenide, glass, sapphire. The substrate 402 may have various dimensions, such as 200 mm, 300 mm, 450 mm or other diameter wafers, as well as, rectangular or square panels. Unless otherwise noted, embodiments and examples described herein are conducted on substrates with a 200 mm diameter, a 300 mm diameter, or a 450 mm diameter substrate. In the embodiment wherein a SOI structure is utilized for the substrate 402, the substrate 402 may include a buried dielectric layer disposed on a silicon crystalline substrate. In the embodiment depicted herein, the substrate 402 may be a crystalline silicon substrate.

The patterned photoresist layer 406 may utilize a directed self-assembly (DSA) of block copolymers (BCPs) process to form the patterned photoresist layer 406 on the substrate 402. Prior to patterning process for forming the patterned photoresist layer 406, a block copolymers (BCPs) including at least two polymers may be formed on the substrate. Examples of the two polymers in the block copolymers (BCPs) may be poly styrene (PS) and poly methylmethacrylate (PMMA). Subsequently, a thermal process may be performed to promote phase separation between the two polymers of the block copolymers (BCPs) so as to promote directed self-assembly of the two polymers into an ordered pattern with repeated structural units based on the guidance defined on the substrate 402. After the two polymers of the block copolymers (BCPs) are self-assembled into the ordered pattern, a development process (e.g., a dry etching or a wet etching process) may be performed to remove one of the polymers, leaving the other polymer on the substrate to form the patterned photoresist layer 406 on the substrate 402. In one exemplary embodiment depicted herein, the PMMA polymer is removed from the substrate 402, leaving the PS polymer on the substrate 402 to form the patterned photoresist layer 406. Alternatively, the patterned photoresist layer 406 may be formed by other any suitable techniques. For example, the patterned photoresist layer 406 may be formed from a positive tone photoresist, a negative tone photoresist, a UV lithography photoresist, an I-line photoresist, an G-line photoresist, an e-beam resist (for example, a chemically amplified resist (CAR)) or other suitable photoresist.

The optional hardmask layer 404 may be formed between the patterned photoresist layer 406 and the substrate 402 to help sustainability of feature transfer during the silicon recess structure formation process. In some embodiments, an additional neutral layer (not shown), such as an organic layer or an inorganic layer utilized for feature transfer from the photoresist layer 406 to the hardmask layer 404, may be disposed between the hardmask layer 404 and the photoresist layer 406. In one embodiment, the hardmask layer 404 may be a silicon oxide layer, a silicon nitride layer, a silicon oxynitride (SiON) layer, silicon carbide layer, an amorphous carbon layer, a doped amorphous carbon layer, or any suitable organic or inorganic layer. In one embodiment, the hardmask layer 404 is a silicon nitride layer having a thickness between about 5 nm and about 100 nm, such as about 20 nm and about 40 nm, for example about 30 nm.

Figure 4A:
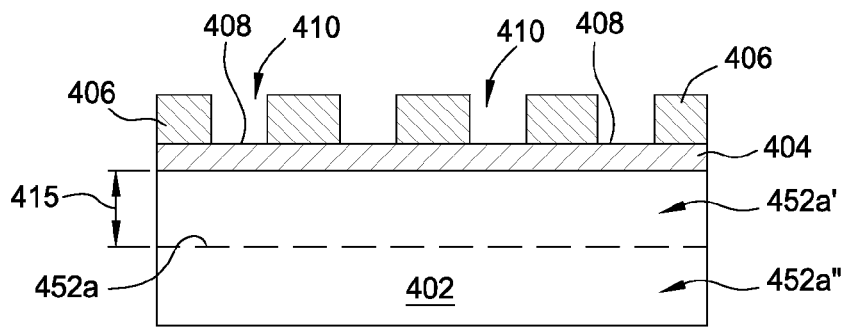
FIG. 4A-4G depict one embodiment of a sequence for forming silicon recess structures on a substrate utilizing a doping layer during the manufacturing process.
Figure 4B:
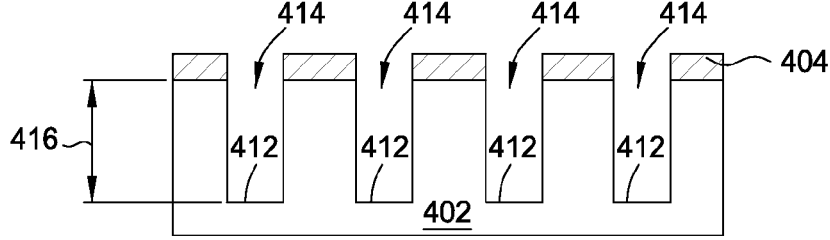

At block 304, a first etching process is performed to etch the substrate 402 to a predetermined depth 416 in the substrate 402, as shown in FIG. 4B, to form the recess structures 414 in the substrate 402. The etching process may etch the hardmask layer 404 along with the substrate 402 in a single step, multiple steps, or separate steps in the same or different etching chambers. In one embodiment, the etching process may be performed in an etching processing chamber, such as the processing chamber 200 depicted in FIG. 2. The substrate 402 may be etched using the patterned photoresist layer 406 and the optional hardmask layer 404, if present, as an etching mask until the predetermined etching depth 416 is reached in the substrate. After the substrate etching process, some portion of the hardmask layer 404 may be remained on the substrate 402, which may be removed later in the subsequent process. In one embodiment, the etching process may be controlled by time mode until the predetermined etching depth 416 is reached.

During processing, an etching gas mixture is supplied into the processing chamber to etch the substrate 402. In one embodiment, a halogen containing gas is supplied in the etching gas mixture. The halogen containing gas is dissociated as reactive etchants by the plasma formed from the etching gas mixture. The halogen ions, such as $F^-$, $Br^-$, and Cl⁻, dissociated from the halogen containing gas in the etching gas mixture may react with and attack the substrate 402 (e.g., with a silicon material) through the feature openings 410 defined by the patterned photoresist layer 406. Suitable examples of the halogen containing gases may include $C_4F_6$, $C_4F_8$, $C_2F_2$, $CF_4$, $CHF_3$, $C_2F_6$, $C_4F_6$, $C_5F_8$, $CH_2F_2$, $SF_6$, $NF_3$, HBr, $Cl_2$, HCl and the like. In an exemplary embodiment, the halogen containing gas used in the gas mixture is HBr.

An inert gas may be optionally supplied with the etching gas mixture to assist carrying the etching gas mixture into the etch chamber. Suitable examples of the inert gases include $N_2$, Ar, He, Xe and Kr gas. Additionally, a carrier gas, or some other gases may also be added into the etching gas mixture to assist carrying gas into the processing chamber for processing and promote completed reaction. Suitable examples of the carrier gas include $N_2$, $O_2$, $N_2O$, $NO_2$, $NH_3$, $H_2O$, $O_3$, and the like.

Several process parameters are regulated while the etching gas mixture is supplied into the etch chamber and while applying the RF power. In one embodiment, the chamber pressure is regulated between about 5 mTorr to about 400 mTorr, for example, at about 40 mTorr. The RF source power of about 200 Watts to about 3000 Watts may be applied to an capacitively coupled antenna source to maintain a plasma inside the etch chamber. The RF bias power of about 200 Watts to about 10000 Watts may be applied to the processing chamber. The fluorine based gas may be flowed into the chamber at a rate between about 30 sccm to about 300 sccm. A substrate temperature is maintained between about −10 degrees Celsius to about 60 degrees Celsius.

At block 306, after the etching process at block 304, a plurality of first silicon recess structures 414 may be formed in the substrate 402. In one embodiment, the plurality of first silicon recess structures 414 expose surfaces 412 of the substrate 402 formed in bottom of the recess structures 414. After the substrate etching process, some portion of the hardmask layer 404 may be remained on the substrate 402, which may be removed later in the subsequent process.

Figure 1A:
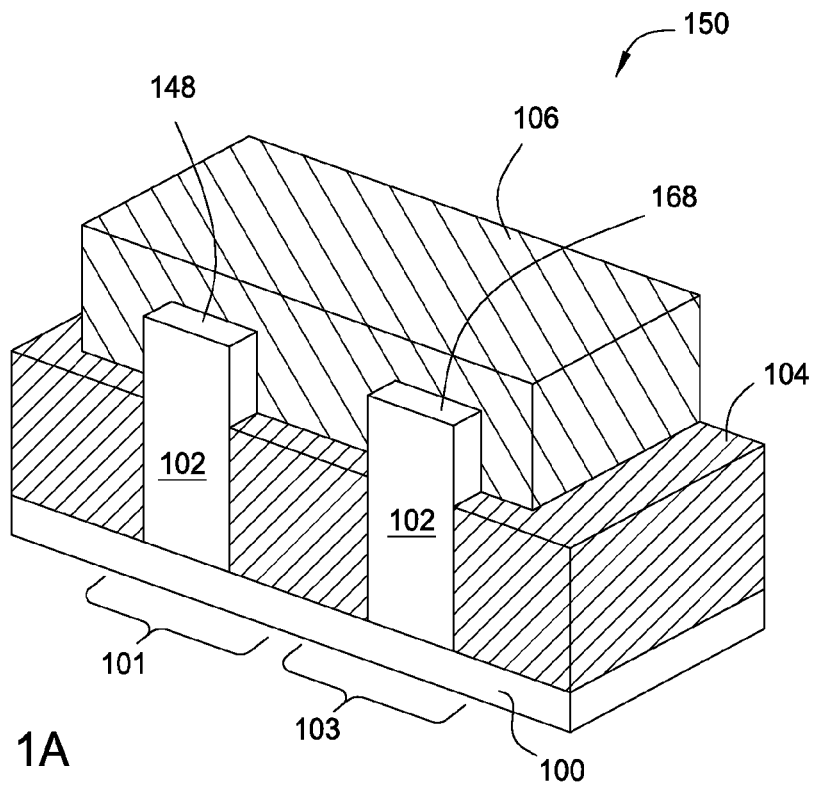
FIG. 1A depicts a schematic perspective view of a substrate having a fin field effect transistor (FinFET) structure formed thereon in a conventional manner.
Figure 1B:
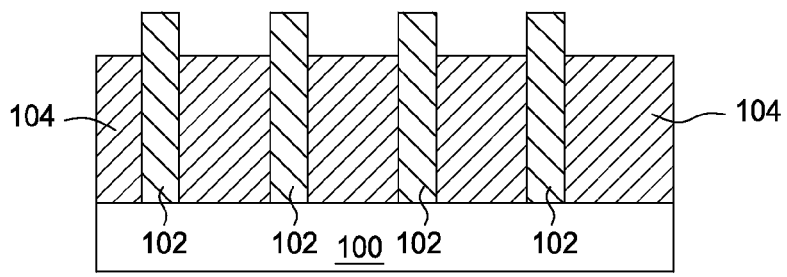
FIG. 1B depicts a cross sectional view of a substrate having a portion of the fin field effect transistor (FinFET) structure formed thereon in a conventional manner.
Figure 1C:
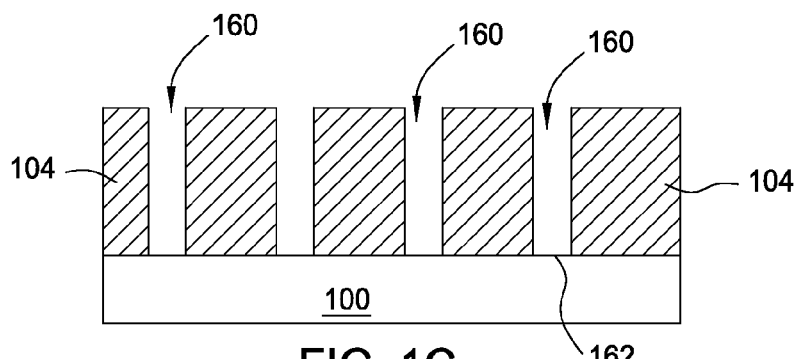
FIG. 1C depicts a cross sectional view of a substrate having a portion of silicon recess structures formed thereon in a conventional manner.
Figure 4C:
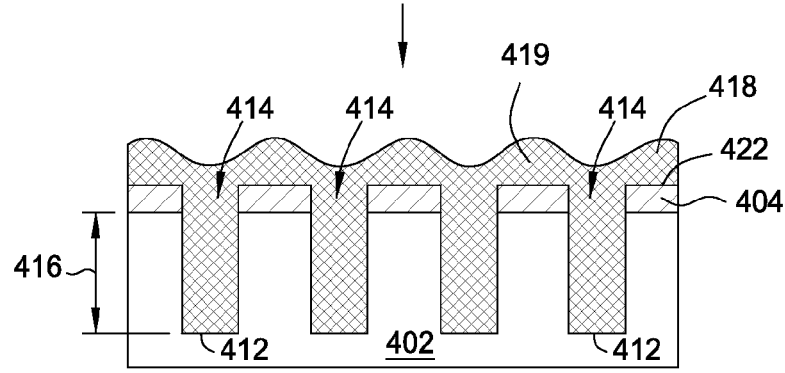

At block 308, after the plurality of first recess structures 414 are formed in the substrate 402, an insulating material filling process is performed to fill the insulating materials 418 into the recess structures 414 in the substrate 402, as shown in FIG. 4C. The insulating materials 418 may be utilized to form shallow trench isolation (STI) structures, such as the shallow trench isolation (STI) structures 104 depicted in FIGS. 1A-1B, in the subsequent process so as to facilitate forming semiconductor fins therebetween for fin field effect transistors (FinFET) manufacture process.

In one embodiment, the insulating material 418 may be a dielectric material, such as silicon oxide material. The insulating material 418 may be formed by a chemical vapor deposition (CVD), a flowable chemical vapor deposition (CVD), a high density plasma (HDP) process, atomic layer deposition (ALD), cyclical layer deposition (CLD), physical vapor deposition (PVD), or the like as needed. In one embodiment, the insulating material 418 is formed by a flowable chemical vapor deposition (CVD).

In one embodiment, the flowable CVD process is performed in a deposition process chamber that may deposit the insulating material 418 utilizing a polysilazanes based silicon containing film (PSZ-like film), which may be reflowable and fillable within trenches, features, vias, recesses or other apertures, such as the recess structures 414, defined in the substrate 402 where the insulating material 418 is deposited. Examples precursors for forming the polysilazanes based silicon containing film are silicon-containing precursors including silane, disilane, methylsilane, dimethylsilane, trimethylsilane, tetramethylsilane, tetraethoxysilane (TEOS), triethoxysilane (TES), octamethylcyclotetrasiloxane (OMCTS), tetramethyl-disiloxane (TMDSO), tetramethylcyclotetrasiloxane (TMCTS), tetramethyl-diethoxyl-disiloxane (TMDDSO), dimethyl-dimethoxyl-silane (DM DMS) or combinations thereof. Additional precursors for the deposition of silicon nitride include $Si_xN_yH_z$-containing precursors, such as sillyl-amine and its derivatives including trisillylamine (TSA) and disillylamine (DSA), $Si_xN_yH_zO_{zz}$-containing precursors, $Si_xN_yH_zCl_{zz}$-containing precursors, or combinations thereof.

Additionally, hydrogen-containing compounds, oxygen-containing compounds, nitrogen-containing compounds, may also be supplied in the deposition gas mixture. Examples of suitable processing precursors include one or more of compounds selected from the group comprising of $H_2$, a $H_2/N_2$ mixture, $NH_3$, $NH_4OH$, $O_3$, $O_2$, $H_2O_2$, $N_2$, $N_xH_y$, compounds including $N_2H_4$ vapor, NO, $N_2O$, $NO_2$, water vapor, or combinations thereof. The processing precursors may be plasma exited, such as in the RPS unit, to include N* and/or H* and/or O*-containing radicals or plasma, for example, $NH_3$, $NH_2$*, NH*, N*, H*, O*, N*O*, or combinations thereof. The process precursors may alternatively, include one or more of the precursors described herein.

After the insulating material 418 has filled in the first recess structures 414 of the substrate 402, a baking process may be performed to densify the insulating material 418. The baking process may allow the insulating material 418 formed on the substrate to become flowable, and to reflow and uniformly fill within the recess structures 414. It is believed that the baking process can assist maintaining the film formed on the substrate surface in a liquid-like flowable state, so as to preserve the flowability and viscosity of the resultant film formed thereon, thereby facilitating complete filling of the insulating material 418 into the recess structures 414 and leaving a recess portion 419 of the insulating material 418 disposed over an surface 422 of the hardmask layer 404, which will be removed later in the process. In one embodiment, the insulating material 418 is a silicon oxide layer made by using a deposition gas mixture including trisillylamine (TSA) and $O_2$ gas.

Figure 4D:
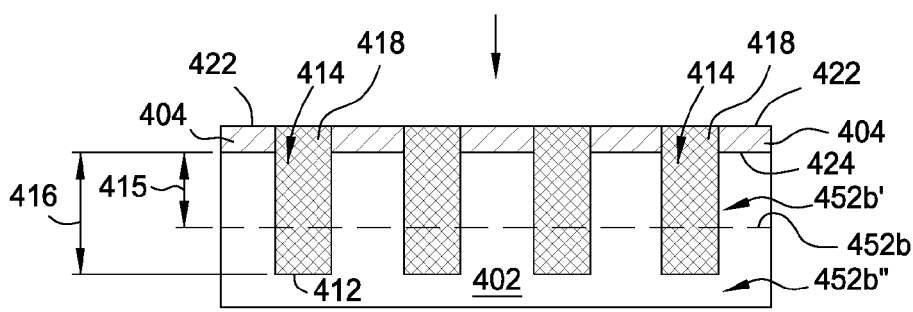
Figure 4E:
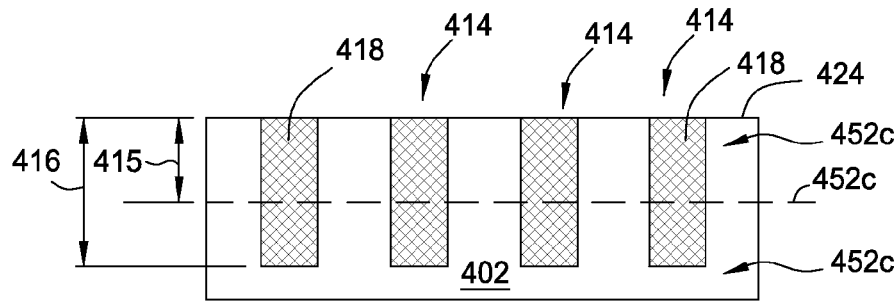

At block 309 or block 311, similar to the ion implantation process described at block 301, after or prior to the recess portion 419 of the insulating material 418 and/or the hardmask layer 404, if present, is removed from the substrate 402 at block 310, an ion implantation process may be performed to implant dopants into the substrate 402 forming doped areas 452b' (as shown in FIG. 4D performed at block 309) or 452c' (as shown in FIG. 4E performed at block 311) defining a doping layer 452b (as shown in FIG. 4D performed at block 309) or a doping layer 452c (as shown in FIG. 4E performed at block 311) in the substrate 402 with the predetermined doping depth 415. It is noted that the doping layer 452a (as shown in FIG. 4A performed at block 301), 452b (as shown in FIG. 4D performed at block 309), 452c (as shown in FIG. 4E performed at block 311) may be formed at any stages when manufacturing silicon recess structures in the substrate 402. The doping layer 452a, 452b, 452c may be formed in any order or in any stage as pointed out at process 300 depicted in FIG. 3 based on different process sequence arrangements.

During the ion implantation process, dopants with different ion properties are implanted and driven into the substrate 402. The dopants in the doping area 452a', 452b' or 452c' defining the doping layer 452a, 452b, 452c, which serves as a block layer/etching stop layer that prevents the substrate 402 from overetching when reaching to the doping layer 452a, 452b, 452c. It is believed that the dopants implanted into the doping area 452a', 452b' or 452c' may react with the etchant at a faster (or slower) etching rate to enhance the etching selectivity, as compared to the undoped area 452a", 452b" or 452c" in the substrate. By utilizing the etching rate difference between the doping area 452a', 452b' or 452c' and undoped area 452a", 452b" or 452c" in the substrate 402, a nature etching barrier, the defined doping layer 452a, 452b, 452c, may be formed as an etching stop layer/blocking layer to efficiently control an etching stop point during the etching process. For example, when n-type dopants are selected to be impinged into the silicon lattice structures to form the doped area 452a', 452b' or 452c' on the substrate 402, the n-type dopants may be inserted into the interstitial sites between the silicon atoms in the lattice structure, thereby changing the Fermi level of Si substrate with n-type dopants, resulting in the bandgap of n-doped silicon in the doped areas 452a', 452b', 452c' close to the conduction band. It is believed n-type dopants doped in the doped areas 452a', 452b', 452c' may provide free electrons during the etching process. As such, when a halogen containing gas, such as a chlorine containing gas, is utilized during the etching process, the free electron provided from the n-type dopants in the silicon tends to rapidly react with the chlorine containing gas through electron transfer process (i.e., as chlorine containing gas is known to have it high tendency for grabbing electron during a chemical reaction), thereby efficiently increasing silicon substrate etch rate. As compared to the undoped area 452a", 452b", 452c" (e.g., intrinsic silicon areas or lightly p-type doped areas) without n-type dopants, lack of free electrons as a media for promoting chemical reaction may result in significantly low etching rate, thereby creating a nature reaction barrier (at the interface of the doping layer 452a, 452b, 452c) to prevent the etchants from further etching when reaching to the undoped area 452a", 452b", 452c" with relatively low etching rate. Accordingly, the doping layer 452a, 452b, 452c defined by the doped areas 452a', 452b', 452c' serves as an etching stop layer that prevents the ions from the etchant to penetrate therethrough. Therefore, by selecting proper ions to be doped in the substrate 402, an efficient etching stop layer may be created to provide an etching process with high selectivity, such as greater than 1000. Thus, the high electivity of the etching process may assist forming desired etch front profile and to minimize etch depth variations in areas of different pattern densities to eliminate undesired microloading effects and obtain a recess structure profile (e.g., trenches, recess structures, features, vias, holes, or the like) in the substrate 402 with desired dimension (e.g., depth and width of the structure) and sidewall/bottom management.

In one embodiment, the dopants selected to be implanted into the substrate 402 may be n-type dopants, such as Sb, As, P and N. In the embodiment wherein the n-type dopants are utilized, Sb may be selected as the dopant as the higher molecular weight of Sb may assist the dopants stay at a desired lattice structure in the substrate without undesired drift during an etching process. In some embodiments, p-type dopants, such as B, Al, Ga, and In, may be utilized based on different process requirements. In one particular embodiment, the dopants selected to be implanted into the substrate 402 are n-type dopants selected from a group consisting of Sb, As, P and N. In one embodiment, the dopants may be implanted into the substrate 402 with the predetermined depth 415 between about 50 nm and about 500 nm, such as between about 50 nm and about 300 nm from a surface 424 of the substrate 402, as shown in FIGS. 4D and 4E. It is noted that the predetermined depth 415 defined in the substrate 402 is shorter than the depth 416 defined in the first recess structure 416 to as to form silicon recess structures among the STI structures.

In one embodiment, the dopants may be doped into the substrate 402 using any suitable techniques, such as by using a beam ion implantation process, plasma immersion ion implantation process, or other suitable implantation process. It is noted that a conventional ion implantation process may also utilized to implant ions into the substrate 402 to form doped areas 452a', 452b', 452c' defining the doping layer 452a, 452b, 452c. Conventional ion implantation process utilizing ion guns or ion beams accelerates a majority of ions up to a certain energy resulting in implanting accelerated ions into a certain deep regions of the substrate. Typically, conventional ion implantation process has the capability to implant ions into a deeper region of the substrate, as compared to the ions implanted by the plasma immersion ion implantation process. The ions provided in the plasma immersion ion implantation process do not generally have a beam-like energy distribution as the ions in conventional beam liners. However, under suitable adjustment of process parameters, ion implantation performance from the plasma immersion ion implantation process and the conventional ion beam implantation process may have similar results to have the desired ions implanted into a substrate with desired profile and distribution. In most of the embodiments, the higher energy required from the conventional ion gun (or an ion beam) ion implantation process can provide ions with higher implantation energy to penetrate into a deeper region from the substrate surface. In contrast, the plasma immersion ion implantation process utilizing RF power to plasma dissociate ions for implanting requires less energy to initiate the plasma immersion ion implantation process so that the ions generated from the plasma can be implanted into a relatively shallow depth from the substrate surface.

In one example, the dopants are doped into the substrate 402 using a plasma immersion implantation process. As discussed above, plasma immersion implanting ions shallow in the substrate 402 may cause bonding structure change in the implanted area. The degree of change may be selected by tuning the depth of the implant. The size of ion being implanted will also affect the energy needed to implant ions to a given depth. It is noted that the ions provided in a plasma immersion ion implantation process, as described herein, are generated from a plasma formed by applying a high voltage RF or any other forms of EM field (microwave or DC) to a processing chamber. The plasma dissociated ions are then biased toward the substrate surface and implanted into a certain desired depth from the substrate surface.

After the doped areas 452a', 452b', 452c' are formed in the substrate 402 defining the doping layer 452a, 452b, 452c, an optional annealing process may be performed to activate the dopants as implanted therein as well as securely the dopants at a desired lattice sites in the substrate as needed. In one embodiment, the annealing process may have an annealing temperature between about 600 degrees and about 1500 degrees Celsius.

As discussed above, at block 310, an etching process or a polishing process may be performed remove the excess portion 419 of the insulating material 418 from the substrate 402, as shown in FIG. 4D, to expose the underlying hardmask layer 404, if present. In the embodiment wherein the hardmask layer 404 is not present, the excess portion 419 of the insulating material 418 from the substrate 402 may be removed to expose the upper surface 424 of the substrate 402, having the insulating material 418 filled in the first recess structures 414 without covering the upper surface 424 of the substrate 402, as shown in FIG. 4E.

In one embodiment, the etching process or the polishing process may be an one step etching/polishing process to remove both the excess portion 419 of the insulating material 418 and the hardmask layer 404 simultaneously. In another embodiment, the etching process or the polishing process may be a multiple step etching/polishing process to remove the excess portion 419 of the insulating material 418 and the hardmask layer 404, if present, separately at different stage of the etching process or the polishing process. In one embodiment, the excess portion 419 of the insulating material 418 and the hardmask layer 404 are removed by a chemical mechanical polishing (CMP) process.

Figure 4F:
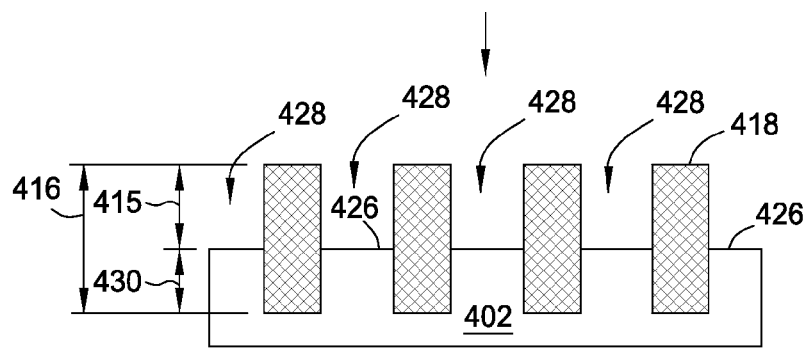
Figure 4G:
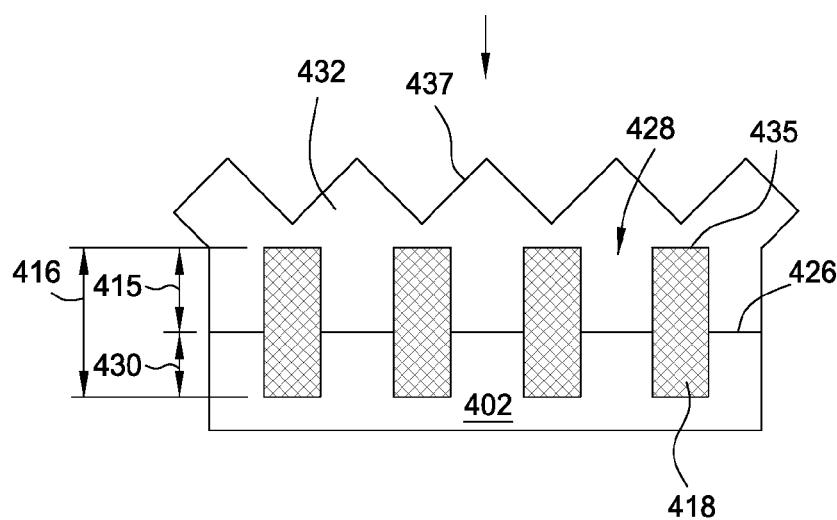

At block 312, after at least one of the doping layers 452a, 452b, 452c are formed in the substrate 402 at the process step of the blocks 301, 309, 311, a second etching process may be performed to form a second recess structure 428 to remove portion of the substrate 402 between the insulating materials 418, which are utilized as shallow trench isolation (STI) structures, as shown in FIG. 4F. The etching process as utilized at block 312 may be similar to the etching process utilized at block 304 as the first etching processes performed at these two blocks are all intended to etch the substrate 402, such as a silicon material. In this particular etching process, the doping layers 452a, 452b, 452c are utilized as an etching stop layer/blocking layer to provide the etching process an ending boundary in the substrate 402 from overetching. The aggressive etchants from the etching process continues to etch the substrate 402 until a surface 426 defined by one of the doping layers 452a, 452b, 452c having a predetermined depth 415 in the substrate 402 is reached and the etching process is then terminated. In one embodiment, the predetermined depth 415 where the doping layer 452a, 452b, 452c is defined is slightly shorter than the depth 416 where the first recess structure 414 where the insulating material 418 is filled, such as a depth difference 430 between about 50 nm and about 300 nm.

The etching process etches the silicon materials from the substrate 402 defined between the insulating materials 418, forming the second recess structures 428 in the substrate 402. The second recess structures 428 formed in the substrate 402 may then be utilized to form semiconductor fins, such as the semiconductor fins 102 described in FIGS. 1A-1B in the subsequent process, when the semiconductor fin is desired to manufacture from a material different from the material made from the substrate 402.

In one embodiment, the second recess structures 428 may be etched by supplying an etching gas mixture into an etching processing chamber, such s the processing chamber 200 depicted in FIG. 2. In one embodiment, a halogen containing gas is supplied in the etching gas mixture. The halogen containing gas is dissociated as reactive etchants by the plasma formed from the etching gas mixture. The halogen ions, such as $F^-$, $Br^-$, and $Cl^-$, dissociated from the halogen containing gas in the etching gas mixture is selected so as to only selectively etch the silicon material of substrate 402 defined between the insulating materials 418, instead of etching the insulating materials 418. In one embodiment, the halogen ions as selected have a high selectivity for the silicon materials to the silicon oxide materials. Suitable examples of the halogen containing gases may include $C_4F_6$, $C_4F_8$, $C_2F_2$, $CF_4$, $CHF_3$, $C_2F_6$, $C_4F_6$, $C_5F_8$, $CH_2F_2$, $SF_6$, $NF_3$, HBr, $Cl_2$, HCl, and the like. In an exemplary embodiment, the halogen containing gas used in the gas mixture is chlorine containing gas, such as $Cl_2$, HCl and the like.

An inert gas may be optionally supplied with the etching gas mixture to assist carrying the etching gas mixture into the etch chamber. Suitable examples of the inert gases include $N_2$, Ar, He, Xe and Kr gas. Additionally, a carrier gas, or some other gases may also be added into the etching gas mixture to assist carrying gas into the processing chamber for processing and promote completed reaction. Suitable examples of the carrier gas include $N_2$, $O_2$, $N_2O$, $NO_2$, $NH_3$, $H_2O$, $O_3$, and the like.

Several process parameters are regulated while the etching gas mixture is supplied into the etch chamber applying the RF power. In one embodiment, the chamber pressure is regulated between about 5 mTorr to about 400 mTorr, for example, at about 40 mTorr. The RF source power of about 200 Watts to about 3000 Watts may be applied to an capacitively coupled antenna source to maintain a plasma inside the etch chamber. The RF bias power of about 200 Watts to about 10000 Watts may be applied to the processing chamber. The fluorine based gas may be flowed into the chamber at a rate between about 30 sccm to about 300 sccm. A substrate temperature is maintained between about −10 degrees Celsius to about 60 degrees Celsius.

It is noted that the dopants utilized to form the doping layer 452a, 452b or 452c may also be removed when exposed during the second silicon recess structure etching process is performed. The exposed surface 426 of the substrate 402 may already have the dopants utilized to define the doping layer 452a, 452b or 452c removed from the substrate 402.

At block 314, after the second silicon recess structures 428 are formed in the substrate 402 in between the insulating materials 418, a deposition process may be performed to deposit/fill a desired material 432 into the recess structure 428. Examples of the suitable desired material 432 to be filled into the second silicon recess structures 428 are silicon germanium (SiGe), Ge containing layer, Group III-V materials, doped or undoped polysilicon materials, doped or undoped amorphous silicon materials, doped crystalline silicon materials and the like.

Thus, methods for forming recess structures in a semiconductor substrate are provided herein. The recess structure with desired profile and dimension control may be obtained by utilizing a doping layer as an etching stop layer/blocking layer during an etching process while forming the recess structure in the substrate. The doping layer may be formed by an ion implantation process to implant dopants into the substrate with a desired doping depth. As such, an etching stop boundary may be well defined during the recess structure manufacturing process so as to obtain the recess structure in a substrate with desired profile and dimension control. Thus, an improved recess structure manufacturing process is obtained, particularly for applications in three dimensional (3D) stacking of semiconductor fin field effect transistors (FinFET), is obtained.

While the foregoing is directed to embodiments of the present invention, other and further embodiments of the invention may be devised without departing from the basic scope thereof, and the scope thereof is determined by the claims that follow.

The invention claimed is:

1. A method of forming recess structures in a substrate comprising:
   etching a first portion of a substrate defined by a second portion formed in the substrate until a doping layer formed in the substrate is exposed; and
   forming recess structures in the first portion of the substrate.

2. The method of claim 1, wherein the doping layer includes n-type dopants formed in the substrate to define the doping layer.

3. The method of claim 1, wherein the first portion of the substrate includes n-type doped silicon materials.

4. The method of claim 1, wherein the second portion formed in the substrate includes insulating materials.

5. The method of claim 4, wherein the insulating material is a silicon oxide material configured to form shallow trench isolation (STI) structures in the substrate.

6. The method of claim 1, wherein the recess structure has a depth between about 5 nm and about 500 nm from a surface of the substrate.

7. The method of claim 1, wherein the doping layer is formed by an ion implantation process.

8. The method of claim 1, wherein the etching process further comprises:
supplying an etching gas mixture including chlorine containing gas to etch the first portion of the substrate.

9. The method of claim 1, wherein the second portion of the substrate includes a recess structure having a depth between about 50 nm and about 500 nm from a substrate of the substrate.

10. A method of forming recess structures in a substrate comprising:
performing a first etching process to etch a substrate through openings defined by a patterned mask layer disposed on a surface of the substrate;
forming a first recess structure in the substrate;
filling an insulating material in the first recess structure in the substrate;
performing a second etching process to etch the substrate defined between the insulating material filled in the first recess structure;
terminating the second etching process when a doping layer defined in the substrate is reached, wherein the doping layer serves as an etching barrier for etching termination determination; and
forming a second recess structure in the substrate.

11. The method of claim 10, wherein the first recess structure has a depth greater than the second recess structure.

12. The method of claim 10, wherein the doping layer is defined by a doped area implanted in the substrate by an ion implantation process prior to performing the first etching process.

13. The method of claim 10, wherein the doping layer is defined by a doped area implanted in the substrate by an ion implantation process after filling the insulating material in the first recess structure in the substrate.

14. The method of claim 10, wherein the doping layer is defined by a doped area implanted by n-type dopants doped into the substrate by an ion implantation process.

15. The method of claim 10, wherein the insulating material is a silicon oxide layer.

16. The method of claim 10, where the second portion of the substrate includes doped silicon material.

17. The method of claim 10, further comprising:
filling the second recess structure with a silicon germanium material.

18. The method of claim 10, wherein filling the insulating material in the first recess structure further comprises:
removing the patterned mask layer remained on the substrate from the substrate.

19. The method of claim 18, the doping layer is defined by a doped area implanted in the substrate by an ion implantation process after the remained patterned mask layer is removed from the substrate.

* * * * *